United States Patent
Praino et al.

(10) Patent No.: US 7,855,490 B2
(45) Date of Patent: Dec. 21, 2010

(54) PLANAR SPRING ASSEMBLY WITH ATTACHED SOLDER STRIP AND METHOD FOR MAKING SAME

(75) Inventors: Joseph Praino, Washington Township, NJ (US); Sanjiv Chhahira, New Rochelle, NY (US)

(73) Assignee: Interplex Nas, Inc., College Point, NY (US)

( * ) Notice: Subject to any disclaimer, the term of this patent is extended or adjusted under 35 U.S.C. 154(b) by 260 days.

(21) Appl. No.: 12/271,333

(22) Filed: Nov. 14, 2008

(65) Prior Publication Data

US 2009/0127982 A1    May 21, 2009

Related U.S. Application Data

(60) Provisional application No. 60/987,835, filed on Nov. 14, 2007.

(51) Int. Cl.
    *H01L 41/083*    (2006.01)
(52) U.S. Cl. .................. 310/328; 310/365; 310/366
(58) Field of Classification Search .......... 310/328, 310/365–366
    See application file for complete search history.

(56) References Cited

U.S. PATENT DOCUMENTS

| | | | |
|---|---|---|---|
| 5,808,241 A | | 9/1998 | Brooks |
| 6,104,129 A * | | 8/2000 | Okamoto .............. 310/366 |
| 6,208,026 B1 * | | 3/2001 | Bindig et al. .............. 257/718 |
| 6,411,018 B1 * | | 6/2002 | Heinz .............. 310/363 |
| 6,522,052 B2 * | | 2/2003 | Kihara et al. .............. 310/366 |
| 6,663,015 B2 * | | 12/2003 | Yamada et al. .............. 239/102.1 |
| 6,700,306 B2 * | | 3/2004 | Nakamura et al. .............. 310/328 |
| 6,798,059 B1 * | | 9/2004 | Ishihara et al. .............. 257/700 |
| 7,385,337 B2 * | | 6/2008 | Mochizuki et al. .............. 310/365 |
| 7,439,655 B2 * | | 10/2008 | Asano et al. .............. 310/328 |
| 2001/0004181 A1 | | 6/2001 | Jaenker |
| 2003/0018267 A1 | | 1/2003 | Erikson et al. |
| 2006/0055288 A1 * | | 3/2006 | Heinzmann et al. .......... 310/364 |
| 2007/0164639 A1 * | | 7/2007 | Ohmori et al. .............. 310/366 |
| 2009/0179527 A1 * | | 7/2009 | Kaspar et al. .............. 310/366 |

\* cited by examiner

*Primary Examiner*—J. SanMartin
(74) *Attorney, Agent, or Firm*—Weingarten, Schurgin, Gagnebin & Lebovici LLP

(57) ABSTRACT

There is disclosed for use with a piezoelectric stack, first and second side electrodes, each side electrode having two serpentine shape members positioned in a common plane, where the two serpentine shape members of an electrode have alternately spaced conductive fingers which project outward toward each other. The conductive fingers are adapted to be electrically coupled to the ends of alternate ones of internal electrode layers of the piezoelectric stack. The undersides of the conductive fingers which contact the ends of the internal electrodes are provided with a solder material to provide good electrical contact by applying the soldered finger to the internal electrode and applying heat to reflow the solder. The serpentine shape of the side electrodes here disclosed provides high flexibility which can absorb displacement of the internal electrodes as they move up, down, in and out as the piezoelectric layers of the stack expand and contract. This flexibility helps to avoid electrical contact separation between the side electrodes and the internal electrodes.

24 Claims, 3 Drawing Sheets ns PLANAR SPRING ASSEMBLY WITH
ATTACHED SOLDER STRIP AND METHOD
FOR MAKING SAME

CROSS REFERENCE TO RELATED APPLICATIONS

This application claims the benefit under 35 U.S.C. §119(e) of U.S. Provisional Application 60/987,835, filed Nov. 14, 2007, the entire disclosure of which is incorporated by reference.

FIELD OF THE INVENTION

The present invention relates to a flat spring with an attached solder strip.

BACKGROUND

Piezoelectric stacks are composed of piezoceramic wafers that are stacked physically in series but are connected electrically in parallel. Piezoceramic wafers are elements that can be stressed electrically. When a voltage is applied, their dimensions change and a resulting force is exerted by the piezoceramic.

As shown in FIG. 1, a stacked piezoelectric device 10 includes a piezoelectric stack formed of alternating piezoelectric layers 12 and 14, internal electrode layers 16 and 18 alternately located between the piezoelectric layers 12 and 14 for applying positive and negative voltages to the piezoelectric layers 12 and 14, and a pair of side electrodes 24 formed on the sides 20 and 22 of the piezoelectric stack.

In the piezoelectric stack, the internal electrode layers 16 are arranged to be exposed to the side 20, while the internal electrode layers 18 are arranged to be exposed to the other side 22.

A side electrode 24 is located on each side 20 and 22 of the piezoelectric stack in such a manner as to be electrically coupled to each of the internal electrode layers 16 and 18 separately. The electrode on side 22 (not visible in FIG. 1.) is electrically connected to the ends of the internal electrode layers 18

When an electric field having the same polarity and orientation as the original polarization field of the piezoceramic material is placed across the thickness of a single layer of piezoceramic material, its thickness increases (i.e. along the axis of polarization). At the same time, the layer contracts in the transverse direction (i.e. perpendicular to the axis of polarization).

Because the various layers of the stack are expanding and contracting, both longitudinally and laterally, the prior art stacked piezoelectric device 10 of FIG. 1 has the problem that cracking of the layers and separation of the electrical connection between the side electrodes and the internal electrodes layers tend to occur at the junction where the side electrodes 24 contact the internal electrode layers 16, 18.

Though not shown, the end portion of the electrode layer 18 is exposed to the side 22 to make contact with the side electrode strip 24 on side 22, and the end of the electrode layer 16 does not extend to the side 22 of the piezoelectric stack.

Referring to FIG. 2, the piezoelectric layers 12 and 14 are divided into a portion M sandwiched between the electrode layer 16 and the electrode layer 18, and a portion N in contact with the internal electrode layer 16.

Upon application of a voltage from the electrode layers 16 and 18 to the piezoelectric layers 12 and 14, the portion M sandwiched between the internal electrode layers 16 and 18 can be displaced along the height of the stack. The end portion N, however, cannot be displaced, as it is in contact with only one of the internal electrode layers 16 and 18. As a result, stress develops in the portion indicated by dashed line L which is the boundary between portions M and N which is in contact with the portion displaced and the portion not displaced. Thus, the piezoelectric stack may be damaged by cracking occurring from the end portion toward the side.

This damage is most likely to occur after the stacked piezoelectric device is used for a long period of time or in a harsh operating environment. It can be a major cause of device deterioration.

To obviate this problem, it has been proposed to form each internal electrode layer over the entire surface of the corresponding piezoelectric layer.

In this configuration, the electrode layers and the piezoelectric layers have substantially the same area. Also, each side electrode is configured in such a manner that the ends of alternate ones of the internal electrode layers are covered with an insulating film, and the other ends are electrically connected to the side electrode 24, so that each piezoelectric layer is sandwiched between internal electrode layers of different polarities.

This configuration, however, still has the problem of durability of the piezoelectric device.

Specifically, in view of the fact that the stacked piezoelectric device is displaced along both the height and width of the stack as it is cycled, stresses occur at the electrical connections where the internal electrodes are connected to the side electrodes 24 along the height of the stack. Since the connections between the side electrodes and the internal electrodes only occur at a small contact area, the mechanical strength of this connection is so low that they can easily become separated.

As noted above, with the configuration having side contacts 24 of strips of conductive material, such as copper, as shown in FIG. 1, electrically connected to the internal electrode layers in the stack, it is difficult to produce a piezoelectric device high in durability.

SUMMARY OF THE INVENTION

The present invention avoids the problem of the prior art described above by providing a flat spring with an attached solder strip which may be used with a stacked piezoelectric device with yieldable side contacts to obtain high durability.

A feature of the present invention is that each first and second side electrode has two serpentine shaped members positioned flat, side by side, in a common plane, and each of the two members of a side electrode has alternately spaced conductive fingers which project outward along a side of the serpentine shaped members. The conductive fingers are adapted to be electrically coupled to the ends of alternate ones of internal electrode layers exposed to one side of the piezoelectric stack. The bottom sides of the conductive fingers which contact the ends of the internal electrodes are plated with a solder material to provide good electrical contact. The side electrodes here disclosed can move up, down, in and out as the piezoelectric layers of the stack expand and contract, longitudinally and transversely, to avoid electrical contact separation between the side electrodes and the internal electrodes.

Where a piezoelectric stack has curved sides, the two serpentine shaped members of each electrode will lie in a curved plane. Where the contacts on the internal electrodes are at a corner of a piezoelectric stack, the two serpentine shaped members of each electrode will be angled relative to each other.

The foregoing has outlined, rather broadly, the preferred feature of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. While the present invention is embodied in hardware, alternate equivalent embodiments may be employed. Those skilled in the art should also realize that such equivalent constructions do not depart from the spirit and scope of the invention in its broadest form.

BRIEF DESCRIPTION OF THE DRAWINGS

Other aspects, features, and advantages of the present invention will become more fully apparent from the following detailed description, the appended claim, and the accompanying drawings in which:

DETAILED DESCRIPTION

Figure 1:
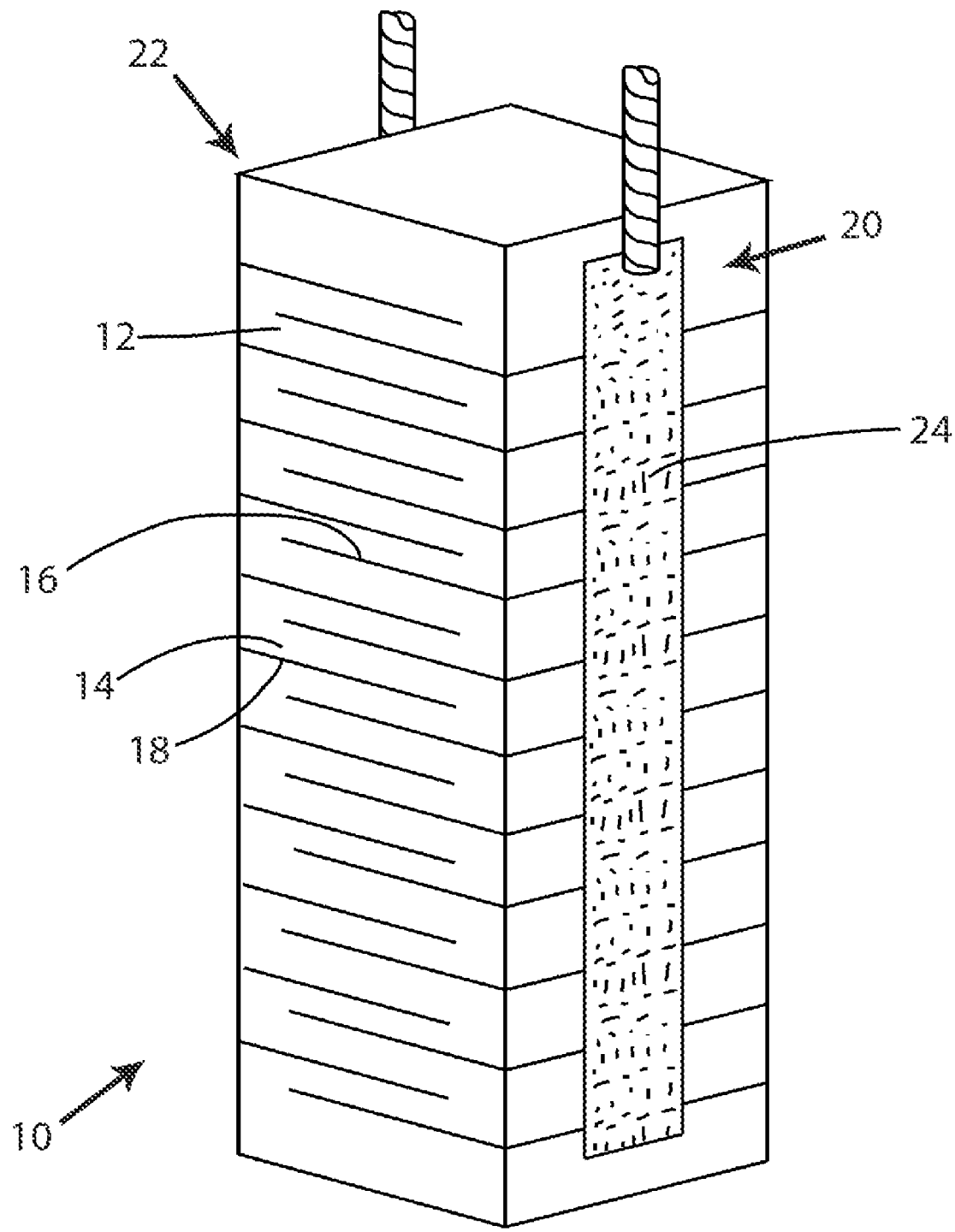
FIG. 1 is a diagram for explaining a conventional stacked piezoelectric device.
Figure 2:
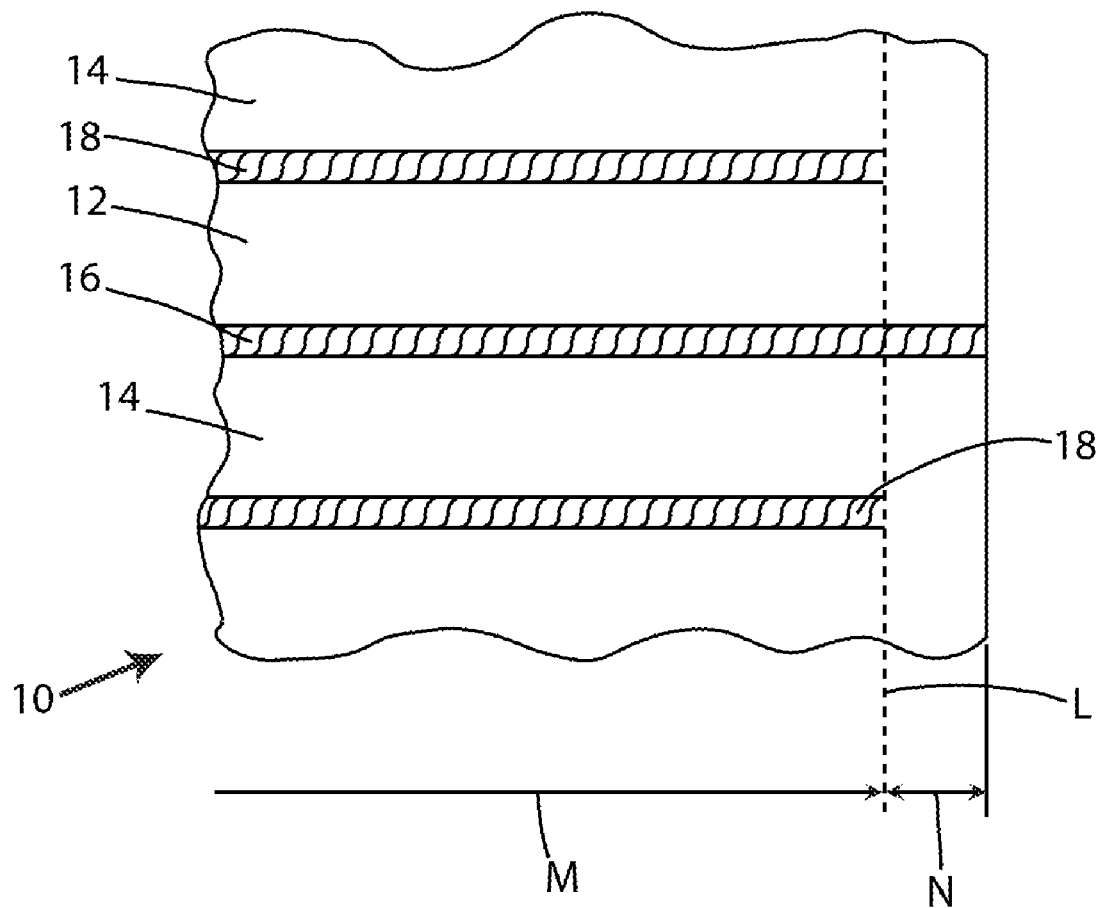
FIG. 2 is a diagram for explaining the problems of the prior art.
Figure 3:
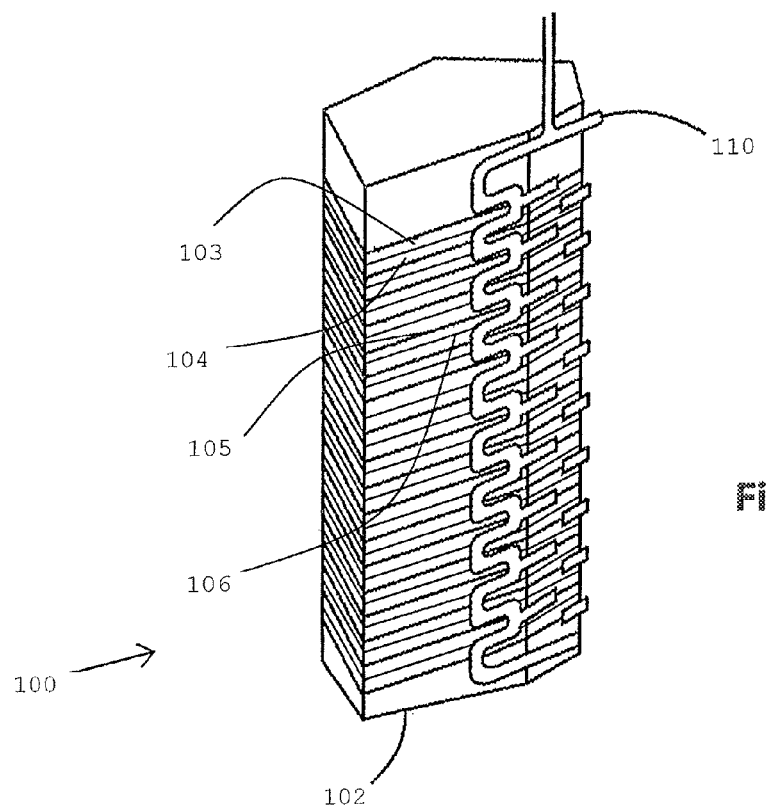
FIG. 3 is a perspective view of a piezoelectric stack having side electrodes in accordance with the principles of the invention.

Referring to FIG. 3, there is shown a stacked piezoelectric device 100 including a piezoelectric stack 102 with piezoelectric layers 103, 104 adapted to expand and contract in accordance with an applied voltage. The piezoelectric layers are stacked alternately with internal electrode layers 105 and 106 for supplying the applied voltage. A first side electrode 110 is located on a first side of the piezoelectric stack, and a second side electrode (not shown) is located on the opposite side of the piezoelectric stack 102. The first and second side electrodes are substantially similar and are shown in greater detail in FIG. 4. Adjacent ones of the internal electrode layers 105 and 106, with corresponding ones of the piezoelectric layers 103 and 104 therebetween, are energized with different polarities by the side electrodes 110.

Also, as shown in FIG. 3, alternate occurring internal electrode layers 105 each have an end thereof exposed to a first side of the piezoelectric stack 102. The ends can be covered with an insulating film such as a resin or left exposed. In a similar way, alternate occurring internal electrode layers 106 have an end exposed to the opposite side of the piezoelectric stack. These ends can be covered with an insulating film such as a resin or left exposed.

The stacked piezoelectric device 100 has first and second side electrodes 110 formed on the opposed sides of the piezoelectric stack 102.

The piezoelectric stack 102 is formed of the piezoelectric layers 103 and 104, and the internal electrode layers 105 and 106 are stacked alternately with each other. The piezoelectric layers 103 and 104 located at the upper and lower ends, respectively, of the piezoelectric stack 102 are what are called "dummy" layers and have no internal electrode layers 105 and 106 with adjacent piezoelectric layers 103 and 104.

In another embodiment the internal electrode layers 105 and 106 may be exposed to all sides of the piezoelectric stack 102.

The side electrodes 110 are connected to lead wires 140 which can be braded and adapted to receive power supplied from an external power source for driving the piezoelectric device.

Figure 4:
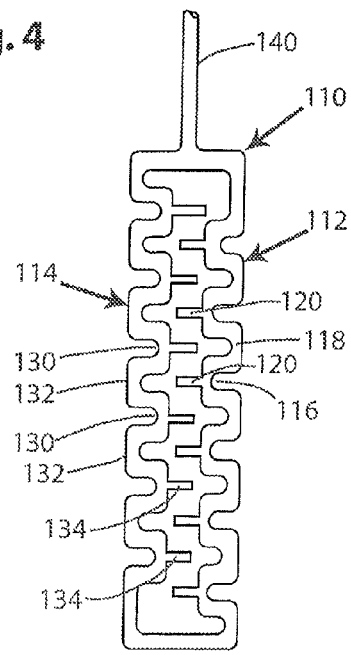
FIG. 4 is a plan view of a side electrode.

Referring to FIG. 4, there is shown a plan view of a side electrode. Each side electrode 110 has two members 112, 114 of conducting material such as copper where the members can be formed with wire or stamped from sheet material. Each member has a configuration which traces a winding and turning course. The first and second conductive members 112, 114 each has a serpentine shape. Referring to the first conductive member 112, it traces a turning course having inwardly projecting U shaped paths 116 and outwardly projecting U shaped paths 118. The conductive member of each inwardly projecting U shaped path 116 is connected, at its apex, to an inwardly projecting finger 120 of conducting material. The second conductive member 114 has a serpentine shape having inwardly projecting U shaped paths 130 and outwardly projecting U shaped paths 132. The conductive member of each inwardly projecting U shaped path 130 is connected, at its apex, to an inwardly projecting finger 134 of conducting material. The first and second conductive members 112, 114 are connected together at each end, and a conductor 140 is provided to feed a potential to the two conductive members of the side electrode. As shown in FIG. 4, the inwardly projecting U shaped paths of the first conductive members are aligned with the outwardly projecting U shaped paths of the second conductive member, and the projecting fingers of the first and second conductive members are alternately spaced.

The first and second conductive members can be bent relative to each other to conform to the surface of the piezoelectric stack to which it is attached, and the fingers of the conductive members can be bent to make good electrical contact with internal electrode layers in the stack.

The plurality of fingers can make electrical contact with the internal electrode layers by either pressing against the ends of internal electrode layers or by being soldered to the ends of internal electrode layers.

According to an embodiment of the present invention, solder is placed on the underside of the fingers by placing the fingers over a thin strip of solder and then applying pressure to force the fingers into the solder.

When connecting the side electrodes to the internal electrodes in the piezoelectric stack, the solder side of the fingers are placed on the ends of the electrodes and heat is applied to the fingers to solder the fingers to the internal electrodes. The side electrodes here disclosed are not easily separated from the internal electrode layers as the piezoelectric device is expanded and contracted along the height of the stack. Thus, a piezoelectric device is obtained which has improved reliability and can be repeatedly used for an extended period of time in a harsh operating environment.

The side electrodes here disclosed can be used with stacked piezoelectric devices having different shapes of piezoelectric layers such as devices having an octagonal shape, a square shape, a barrel shape, etc.

While there has been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

What is claimed is:

1. An electrode for a piezoelectric stack comprising:
   a first conductive member having a substantially serpentine shape including a plurality of winding paths, the plurality of winding paths including inwardly projecting paths and outwardly projecting paths;
   a second conductive member having a shape similar to the first conductive member, the first and second conductive members being electrically coupled to one another;
   a plurality of conductive fingers extending from a portion of the winding paths; and
   solder disposed on an underside of each of the plurality of conductive fingers,
   wherein the plurality of conductive fingers extend from the inwardly projecting paths of each of the first and second conductive members toward the other of the first and second conductive members.

2. The electrode of claim 1 wherein the winding paths are substantially U-shaped.

3. The electrode of claim 2 wherein each conductive finger extends from an apex of a respective U-shaped winding path.

4. The electrode of claim 1 wherein each of the first and second conductive members includes a first end and a second end, and wherein each of the first ends are connected together and each of the second ends are connected together.

5. The electrode of claim 1 wherein at least one of the first and second conductive members includes copper.

6. The electrode of claim 1 wherein the first and second conductive members are connected to a conductor for providing an electrical potential to the first and second conductive members.

7. The electrode of claim 1 wherein the solder disposed on the underside of each of the plurality of conductive fingers comprises a strip of solder into which the conductive fingers have been pressed.

8. A side electrode for a piezoelectric stack comprising:
   first and second conductive members, each of the first and second conductive members being disposed side by side and electrically coupled to one another and each having a same substantially serpentine shape including a plurality of inwardly projecting paths and outwardly projecting paths;
   a plurality of conductive fingers extending from the inwardly projecting paths of the first and second conductive members; and
   solder disposed on an underside of each of the plurality of conductive fingers,
   wherein the plurality of conductive fingers extend from the inwardly projecting paths of each of the first and second conductive members toward the other of the first and second conductive members.

9. The side electrode of claim 8 wherein each of the first and second conductive members includes a first end and a second end, and the first and second conductive members being electrically connected to one another at their respective first and second ends.

10. The side electrode of claim 8 wherein the first and second conductive members include copper.

11. The side electrode of claim 8 wherein each of the first and second conductive members is connected to a conductor for providing an electrical potential to the first and second conductive members.

12. The side electrode of claim 8 wherein the inwardly projecting paths of the first conductive member are aligned with the outwardly projecting paths of the second conductive member and the outwardly projecting paths of the first conductive member are aligned with the inwardly projecting paths of the second conductive member.

13. The side electrode of claim 12 wherein the conductive fingers alternately extend from the first conductive member and the second conductive member along a length of the side electrode.

14. The side electrode of claim 8 wherein the inwardly projecting paths and the outwardly projecting paths are substantially U-shaped.

15. The side electrode of claim 14 wherein the conductive fingers extend from an apex of the U-shaped paths.

16. The side electrode of claim 8 wherein the first and second conductive members are coplanar.

17. The side electrode of claim 8 wherein the solder disposed on the underside of each of the plurality of conductive fingers comprises a strip of solder into which the conductive fingers have been pressed.

18. A piezoelectric stack comprising:
   a plurality of alternatingly stacked first and second piezoelectric layers;
   a plurality of first internal electrode layers disposed above each first piezoelectric layer;
   a plurality of second internal electrode layers disposed above each second piezoelectric layer;
   a first side electrode including:
      first and second conductive members, the first and second conductive members being disposed side by side and electrically coupled to one another and each having a same substantially serpentine shape including a first plurality of inwardly projecting paths and a first plurality of outwardly projecting paths,
      a first plurality of conductive fingers extending from the first plurality of inwardly projecting paths of the first and second conductive members, the first plurality of conductive fingers extending from the inwardly projecting paths of each of the first and second conductive members toward the other of the first and second conductive members; and
      solder disposed on an underside of each of the first plurality of conductive fingers and connecting each of the first plurality of conductive fingers to a respective first internal electrode; and
   a second side electrode including:
      third and fourth conductive members, the third and fourth conductive members being disposed side by side and electrically coupled to one another and each having a same substantially serpentine shape including a second plurality of inwardly projecting paths and a second plurality of outwardly projecting paths,
      a second plurality of conductive fingers extending from the second plurality of inwardly projecting paths of the third and fourth conductive members, the second plurality of conductive fingers extending from the inwardly projecting paths of each of the third and fourth conductive members toward the other of the third and fourth conductive members; and
      solder disposed on an underside of each of the second plurality of conductive fingers and connecting each of the second plurality of conductive fingers to a respective second internal electrode.

19. The piezoelectric stack of claim 18 wherein the first and second pluralities of inwardly projecting paths are substantially U-shaped and wherein the first and second pluralities of conductive fingers extend from an apex of the substantially U-shaped inwardly projecting paths.

20. The piezoelectric stack of claim 18 wherein the first and second conductive members are coplanar and the third and fourth conductive members are coplanar.

21. The piezoelectric stack of claim 18 wherein the first plurality of conductive fingers alternately extend from the first conductive member and the second conductive member along a length of the first side electrode, and wherein the second plurality of conductive fingers alternately extend from the third conductive member and the fourth conductive member along a length of the second side electrode.

22. The piezoelectric stack of claim 21 wherein the first plurality of inwardly projecting paths of the first conductive member are aligned with the first plurality of outwardly projecting paths of the second conductive member and the first plurality of outwardly projecting paths of the first conductive member are aligned with the first plurality of inwardly projecting paths of the second conductive member.

23. The piezoelectric stack of claim 21 wherein the second plurality of inwardly projecting paths of the third conductive member are aligned with the second plurality of outwardly projecting paths of the fourth conductive member and the second plurality of outwardly projecting paths of the third conductive member are aligned with the second plurality of inwardly projecting paths of the fourth conductive member.

24. The piezoelectric stack of claim 18 wherein:
the solder disposed on the underside of each of the first plurality of conductive fingers comprises a strip of solder into which the first plurality of conductive fingers has been pressed; and
the solder disposed on the underside of each of the second plurality of conductive fingers comprises a strip of solder into which the second plurality of conductive fingers has been pressed.

* * * * *